United States Patent [19]
Yokogawa et al.

[11] Patent Number: 5,554,257
[45] Date of Patent: Sep. 10, 1996

[54] METHOD OF TREATING SURFACES WITH ATOMIC OR MOLECULAR BEAM

[75] Inventors: Kenetsu Yokogawa, Hachioji; Yoshimi Kawanami, Kokubunji; Tatsumi Mizutani, Koganei, all of Japan

[73] Assignee: Hitachi, Ltd., Tokyo, Japan

[21] Appl. No.: 270,839

[22] Filed: Jul. 5, 1994

[30] Foreign Application Priority Data

Jul. 21, 1993 [JP] Japan .................................. 5-179593

[51] Int. Cl.$^6$ .................................................. H01L 21/00
[52] U.S. Cl. ...................... 156/643.1; 134/1.3; 156/345; 216/66
[58] Field of Search ................................. 156/345, 643.1; 216/63, 66; 134/1, 1.2, 1.3; 204/298.36

[56] References Cited

U.S. PATENT DOCUMENTS

| | | | |
|---|---|---|---|
| 4,740,267 | 4/1988 | Knauer et al. | 204/192.23 X |
| 5,108,535 | 4/1992 | Ono et al. | 204/298.36 X |
| 5,286,331 | 2/1994 | Chen et al. | 216/66 X |

OTHER PUBLICATIONS

Journal of Applied Physics (64(7), Oct. 1, 1988, pp. 3697–3705.

*Primary Examiner*—William Powell
*Attorney, Agent, or Firm*—Fay, Sharpe, Beall, Fagan, Minnich & McKee

[57] ABSTRACT

A molecular or atomic beam for cleaning or etching semiconductor substrates, or for forming a thin film on a semiconductor substrate is formed by generating a chemical reaction between at least two gases introduced into a reaction chamber. The products of the chemical reaction, and optionally additional atoms or molecules introduced into the reaction chamber, pass through an aperture to form a beam that is projected onto a sample supported in a sample chamber. The translation energy generated by the chemical reaction accelerates the atoms, molecules and/or particles to a high speed to enable cleaning, etching or depositing processes to be formed with the beam without damaging the surface of the substrate being treated.

19 Claims, 5 Drawing Sheets

METHOD OF TREATING SURFACES WITH ATOMIC OR MOLECULAR BEAM

FIELD OF THE INVENTION

The present invention relates to a method of and apparatus for generating a molecular or atomic beam for treating surfaces generally, and more specifically for cleaning or etching a semiconductor substrate or for forming a film on a substrate. In particular, the invention relates to generating an atomic or molecular beam for treating a substrate surface without causing damage to the surface by using atoms or molecules accelerated to a high speed by the translation energy generated from a chemical reaction induced between at least two gases introduced into a reaction chamber.

BACKGROUND OF THE INVENTION

The surface of a semiconductor substrate has conventionally been treated by one of two methods. In the first method, the surface treatment is performed with a solution that produces a chemical reaction. As a result, very little damage is caused to the substrate. However, this method is not suitable for the fine processing of semiconductor substrates, such as etching, and has not been applied in the fabrication of VLSIs except for cleaning the surfaces of semiconductor substrates.

The second most widely used method treats the surface of a substrate with a plasma. This method is broadly used in the fabrication of VLSIs, and unlike the above discussed method that uses a chemical reaction solution, plasma treatment provides fine processing, including etching, and machineability. In plasma etching, however, the plasma contains many particles and charged particles that have a high kinetic energy greater than that required for the surface treatment. These high energy particles can cause serious damage to the semiconductor substrate, and therefore the surface treatment of semiconductor substrates using a plasma is unsatisfactory in many instances.

Another method that has been proposed for treating the surfaces of semiconductor substrates is disclosed by K. Suzuki et al in the Journal of Applied Physics 64(7), Oct. 1, 1988. With this method, the semiconductor substrate surface is irradiated with a hot reactive gas that is blown in the gaseous phase at supersonic speed onto the substrate. The beam produced by this technique is used for etching and does not cause the kind of damage to the substrate surface that is caused by plasma etching. On the other hand, the beam has particles of a relatively low energy, which is insufficient for sustaining a reaction with the surface, and therefore surface treatment with this technique requires a considerable amount of time.

SUMMARY OF THE INVENTION

It is an object of the invention to provide a method and an apparatus for treating surfaces including semiconductor substrate surfaces, to achieve fine processing, including etching with high selectivity, in a highly efficient process thereby overcoming the disadvantages of the prior art surface treatment techniques.

It is an object of the invention to provide an apparatus for generating a molecular or atomic beam by causing a chemical reaction including a chain reaction or a combustion reaction to take place between at least two gases introduced into a chamber, in which additional atoms or molecules are optionally introduced. The reaction generates kinetic or translation energy for projecting a beam of the reaction products and other atoms or molecules optionally introduced into the chamber through an aperture and onto the surface of an object or substrate to be treated. The additional atoms or molecules can either be reactive or not reactive with the object or substrate being treated.

It is a further object of the invention to control the chemical reaction of predetermined gases to generate a predetermined translation energy used for projecting a beam of the reaction products (and additional atoms or molecules optionally introduced in the chamber) that is required to efficiently and precisely treat the surface of a substrate without damaging the surface. The kinetic energy of the reaction provides a beam of atoms, molecules and/or particles that is projected at a speed sufficient to enable efficient application of the treatment method and apparatus to semiconductor fabrication techniques.

It is yet a further object of the invention to generate one or more molecular or atomic beams in accordance with the present invention and to control the projecting of the beams onto the surface of an object or substrate to be treated, including selecting a specific translation energy range of the beams that are projected and/or using a collimator for projecting the beams perpendicularly upon the surface of a substrate or object that is to be treated.

DETAILED DESCRIPTION OF THE PREFERRED EMBODIMENTS

Figure 1:
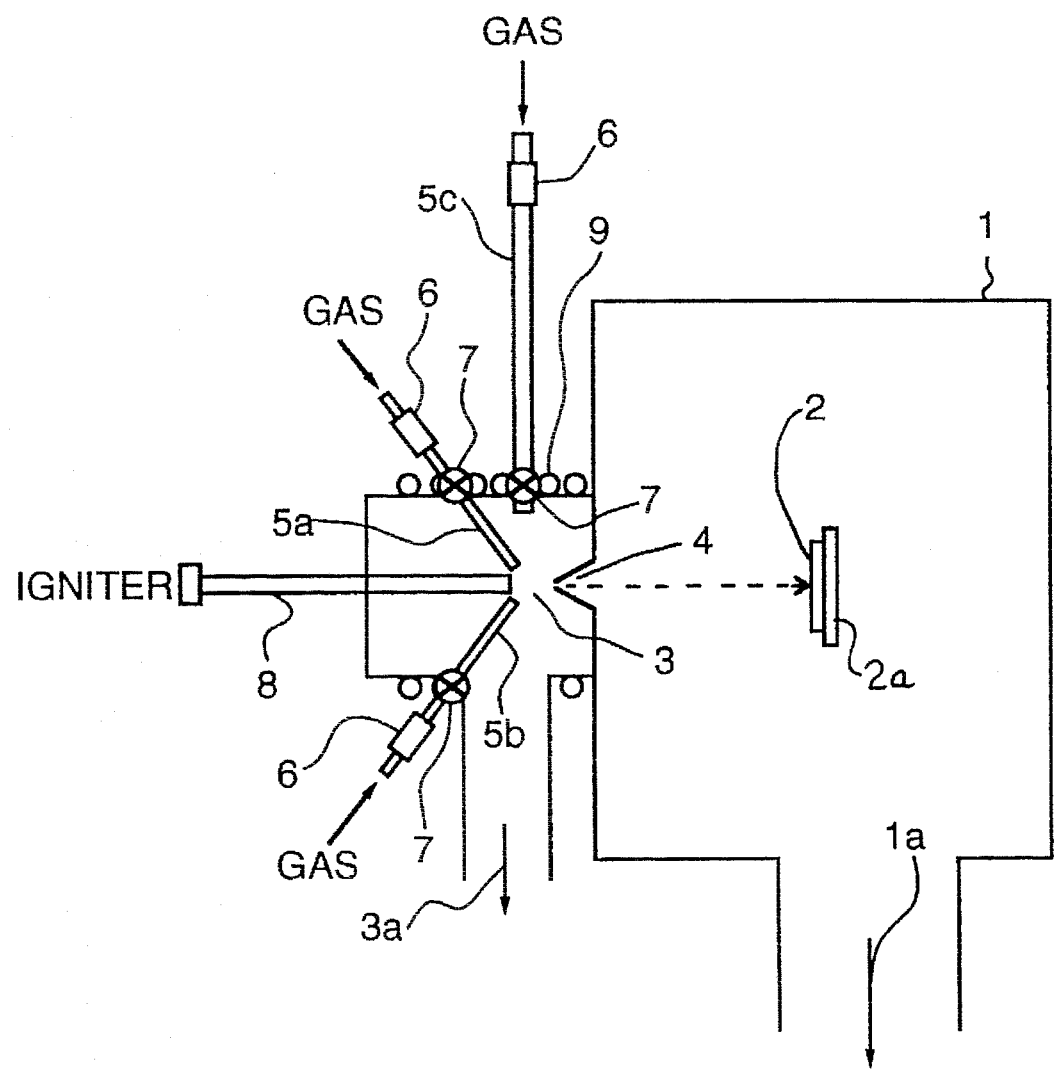
FIG. 1 is a diagram explaining the method and apparatus of the invention according to a first embodiment.

According to the present invention, atoms or molecules of at least two kinds of gases are chemically reacted together in a reaction chamber, and the chemical energy produced by the reaction is converted to kinetic energy for generating an atomic or molecular beam formed by accelerating molecules or atoms of the reaction, as well as other atoms or molecules optionally introduced into the reaction, to a high speed. The beam is then projected onto the surface of an object to be treated. The kinetic energy generated by the chemical reaction between the gases accelerates the atoms or molecules to a sufficiently high speed to enable efficient and fine processing of the surface of a substrate without causing damage.

The kinetic energy of the atoms or molecules that impinge or impact the surface being treated can be controlled by using different constituent gases in the reaction and controlling other factors affecting the reaction and the projecting of the beam so that the kinetic energy of the beam that is projected is between 0.5 to 20 eV. Further, when the atoms or molecules of the beam are reactive with the surface of the substrate or object being treated, the reaction between the substrate and the atoms, molecules and/or particles of the beam can be achieved with high probability so that the surface treatment can be achieved at high speed. On the other hand, the energy of the atoms and/or molecules of the beam that impinge the substrate is not sufficient to cause damage to semiconductor materials and other objects or substrates that are treated in accordance with semiconductor fabrication techniques. Further, if stable atoms, molecules and/or stable particles are used in the beam, the beam can be used for sputter cleaning the surface of the semiconductor substrate without causing damage thereto.

The high energy atoms or molecules generated in the reaction chamber of the apparatus of the present invention are preferably passed through an aperture and projected into a sample chamber and onto the surface of a substrate or object being treated. By controlling the reaction of the gases, including controlling the timing of initiating the reaction and the temperature and pressure of the reaction chamber, for example, and by positioning and controlling the size of the aperture, a highly directional beam can be formed. Such a beam is suitable for fine processing of semiconductor substrates, including etching, and can be efficiently applied in semiconductor fabrication techniques.

The gases that are used in the apparatus of the present invention are introduced into a reaction area of the reaction chamber. Preferably, an igniter is used to initiate combustion of the gases or to initiate a chain reaction of the gases that spreads throughout the reaction chamber that may also include an explosion, for example when the gases are hydrogen and oxygen. The reaction can be sustained by maintaining a suitable vacuum pressure within the reaction chamber, and by controlling the temperature of the chamber.

FIG. 1 shows a first embodiment of the present invention for treating the surface of a sample 2 contained within a sample chamber 1, which is maintained in a vacuum by a vacuum pump that exhausts air from the chamber as indicated by arrow 1a. A reaction chamber 3 is evacuated by a vacuum pump, which is different than the vacuum pump used for chamber 1, indicated by arrow 3a. Chamber 3 has an aperture 4 that opens into sample chamber 1, and in a preferred embodiment the aperture connects the two chambers 1 and 3, but there could be a seaprate connecting portion between the chambers. A suitable range of size for the opening of aperture 4 is between 0.01 mm and 3.0 mm in diameter.

Three different kinds of gases can be introduced into the reaction chamber 3 through gas introduction ports or pipes 5a, 5b and 5c, as shown in FIG. 1. In this embodiment, the two gases that react with one another are introduced into pipes 5a and 5b, while the third gas introduction pipe 5c is provided for the optional introduction of a third gas that may be a catalyst for the reaction between the other two gases, a gas that is neutral or non-reactive with the sample that provides a source of atoms or molecules that impact the sample, or a gas that is reactive with the surface of the substrate 2 that provides a source of atoms or molecules used for etching the substrate. The flow rate of the gases that are introduced are regulated by suitable gas regulating mechanisms 6 in combination with valves 7 that open and close quickly, such as an injection valves for example.

The ends of the pipes 5a and 5b project into the reaction chamber 3 to form a reaction area adjacent an igniter 8, which provides sufficient heat, spark or flame to ignite the constituent gases that are introduced. Preferably, the igniter has closely spaced electrodes to which is applied a high voltage electric discharge for creating a spark, or the igniter has a filament that is resistance heated to a combustion generating temperature. The angle at which the gases introduced through pipes 5a and 5b are projected into the reaction area can vary from 30 to 90 degrees with respect to an axis perpendicular to the aperture 4. The purpose of introducing the gases through pipes 5a and 5b into the chamber at an angle is to create an area of high gas density directed toward aperture 4 in which the reaction can be initiated by igniter 8. Additional gases can be introduced if more than two gases are to be used in the reaction. Only two reaction gas introduction tubes 5a and 5b are shown for illustration prurposes.

Once a reaction occurs in chamber 3, the heat generated by the reaction may require cooling of the chamber. A cooling liquid can be circulated through a heat exchange coil 9 for controlling the temperature of chamber 3. Other suitable cooling techniques can be used for cooling the reaction chamber 3, alternatively or in combination with heat exchanger coils 9.

According to the invention, at least two reactive gases are introduced into chamber 3. For example, hydrogen and oxygen are introduced into chamber 3 through pipes 5a and 5b, respectively. By appropriately controlling the flow regulating mechanisms 6, the ratio of flow rates of hydrogen to oxygen is controlled to be 2 to 1. The pressure in the reaction area 3 is pumped down to a range from about 1.5 to 50 torr. At this pressure, a chain reaction of the hydrogen and oxygen gases can be induced by igniter 8, for example by generating a small electric discharge between two electrodes of the igniter. The chain reaction that takes place is represented by the following formula:

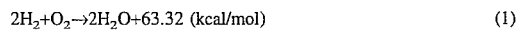

$$2H_2 + O_2 \rightarrow 2H_2O + 63.32 \text{ (kcal/mol)} \quad (1)$$

As represented by formula (1), 63.32 kcal/mol of chemical energy is released by the reaction. The chemical energy is converted into kinetic energy imparted to the $H_2O$ molecules, which are the reaction products of the chain reaction. Ideally, each $H_2O$ molecules that is formed has a kinetic energy of about 2.96(eV). The $H_2O$ molecules are accelerated by this energy from the reaction and are passed through aperture 4 into the chamber 1 to impact upon the sample 2. The vacuum maintained in chamber 1 is lower than that maintained in chamber 3 for promoting the passing of the reaction products into the chamber 1 through aperture 4, and preferably the pressure is from about 0.1 to 0.05 torr in chamber 1. Thus, the pressure in chamber 1 is maintained to be about 10 to 100 times less than that in reaction area 3 by using different vacuum pumps for each of the chambers.

By passing the reaction products (molecules of $H_2O$) through aperture 4, the molecules are directed onto the surface of the sample 2 in a beam like projection. The kinetic energy of the beam of molecules impacting the surface of sample 2 drives out organic contaminating matters and other foreign dirt particles from the surface of the sample for cleaning. The kinetic energy of the high speed $H_2O$ molecules is sufficient for removing the contaminating substances, but is not so high as to cause damage to a semiconductor substrate, e.g. a single crystal silicon substrate, to be processed. Further, unlike cleaning by sputtering, the surface of the substrate experiences significantly little damage and the $H_2O$ molecules of the beam can be kept from remaining on the surface of the sample 2 if the sample is heated to a temperature of about 100° C. A heater for heating the sample 2 is incorporated in a sample support device 2a in the sample chamber 1. Further, the H₂O molecules that remain are chemically stable and do not become a source of contamination on the surface of the sample.

In addition to projecting a beam of $H_2O$ molecules onto the surface of sample 2, halogen molecules, for example, such as chlorine or fluorine molecules or a compound of such halogen molecules can be simultaneously projected onto the surface of the sample 2 with the $H_2O$ molecules. If a gas of halogen molecules or a gas containing halogen compounds is introduced into chamber 3 through feed pipe 5c, for example, the halogen molecules or compounds are accelerated to a high speed by a seeding effect. Thus, the halogen molecules or compounds thereof mix with the high speed $H_2O$ molecules formed by the chemical reaction and are projected with a high kinetic energy or translation energy into chamber 1 and onto the surface of sample 2. High speed halogen molecules or compounds thereof are useful for etching the sample 2. Thus, the apparatus shown in FIG. 1 is suitable for not only cleaning, but also for etching.

In the foregoing description of the first embodiment of the invention, the reaction gases are continuously supplied to the reaction chamber so that an equilibrium of pressure differential is established between the chambers 3 and 1. Further, as discussed in the foregoing, a chain reaction is generated in chamber 3 between the hydrogen and oxygen gases. Thus, the gaseous pressure differential must be maintained in the chambers 3 and 1 so that a sufficient mean free path is given to the atomic rays or the molecular rays under this equilibrium state. This imposes a significant evacuation requirement on the vacuum pumps for the individual chambers, which is also affected by the size of the aperture 4. As a result, difficulty is involved in maintaining the equilibrium state or pressure differential especially when an explosion reaction occurs in reaction chamber 3.

According to a second embodiment of the invention, discussed with reference to FIG. 2, an apparatus similar to that shown in FIG. 1 is operated by introducing the constituent reactive gases at the same time through tubes 5a and 5b, but at predetermined timing intervals. Specifically, unlike the apparatus shown in FIG. 1, the apparatus of the second embodiment includes a control mechanism 10 for operating igniter 8 and for operating or controlling the introduction of the constituent reaction gases through tubes 5a and 5b by controlling the opening and closing of valves 7. Preferably, the igniter is operated synchronously with the opening and closing of gas valves 7, and the gases are introduced in pulses into the reaction area 3.

Figure 3:
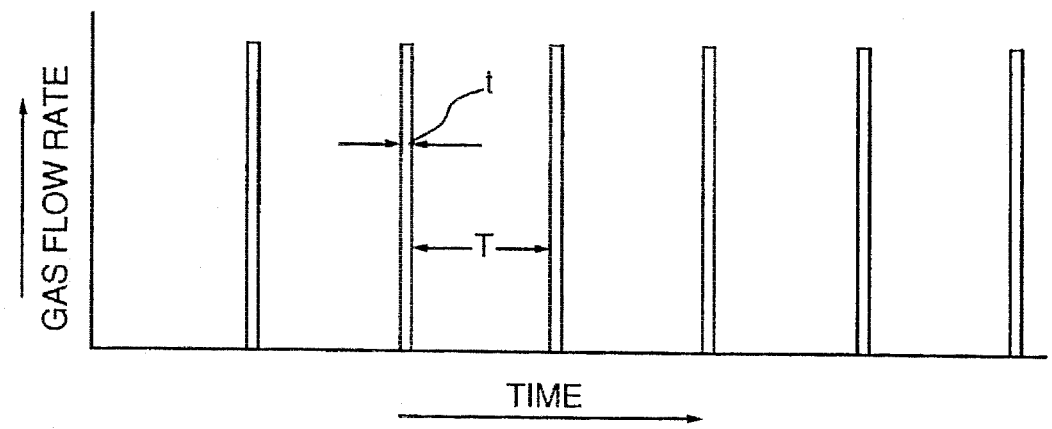
FIG. 3 is a diagram for explaining the timing of the introduction of gases into the reaction chamber of the apparatus of FIG. 2.

FIG. 3 shows a graph representing the periodic introduction of gases into the reaction chamber 3. A typical flow of hydrogen gas would be from 50 to 500 sccm with one half of the corresponding flow rate for oxygen for the case of introducing hydrogen and oxygen gases into the reaction chamber. The duration "t" of opening valves 7 for introducing the gases would be from 1 ms to 1 s, with up to several seconds for the interval of time "T" between injection times.

Figure 4:
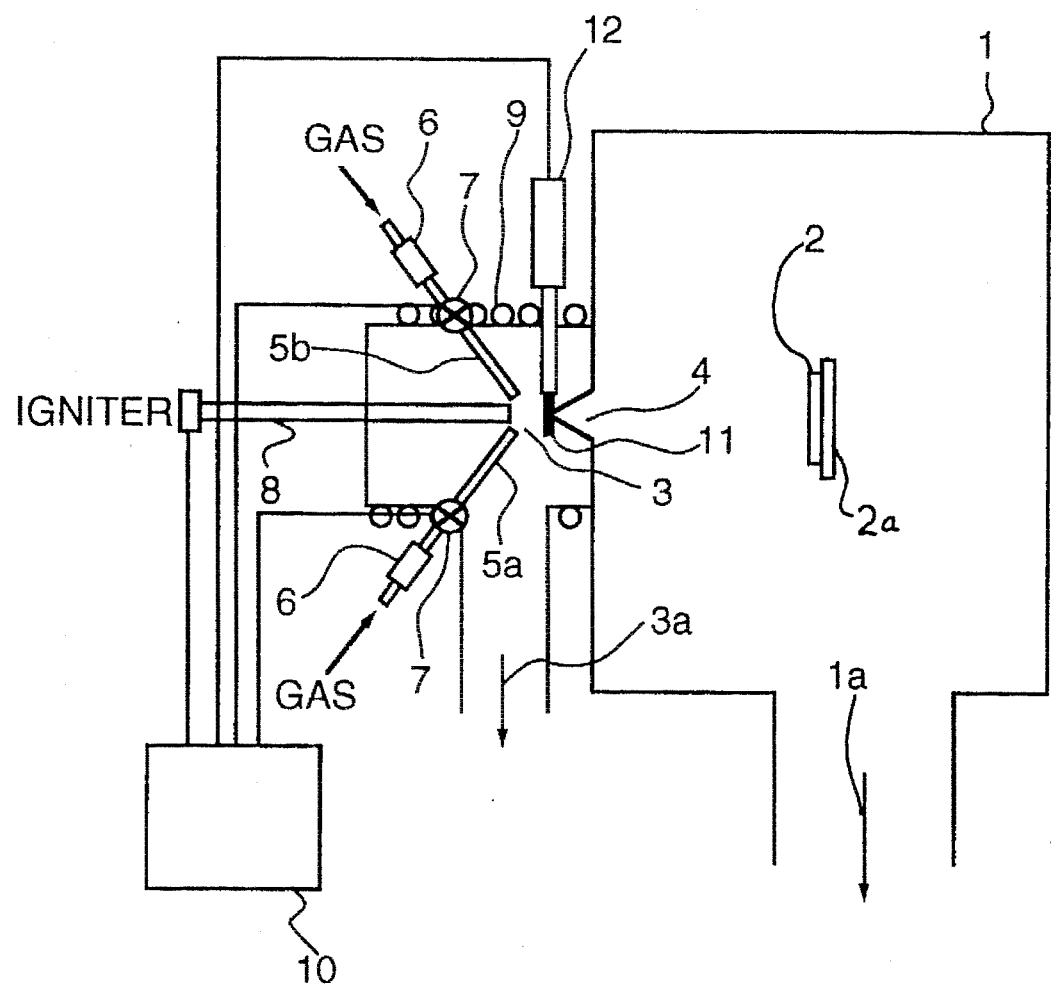
FIG. 4 is a diagram explaining the method and apparatus of the invention according to a third embodiment.

In the apparatus of FIG. 4, a further embodiment is shown wherein a gate valve 11 is disposed adjacent aperture 4 and is opened or closed by a mechanism 12 controlled by controller 10. When the valve 11 is open, the beam is emitted through the aperture 4 to the sample tube. When the chain reaction terminates, valve 11 is closed and reaction chamber 3 is pumped out to remove the residue. Further, the reaction gases are introduced into the chamber through tubes 5a, 5b in accordance with the opening and closing of the valve 11, under control of the controller 10. By repeating these series of operations, the chain reaction in the reaction area 3 can be efficiently induced without losing the vacuum in chamber 1, which is affected by the aperture 4 connecting chambers 1 and 3. The apparatus of FIG. 4 is particularly useful for inducing an explosion reaction in reaction chamber 3, and is therefore capable of forming an atomic or molecular beam having high energy, higher than that formed by the apparatus of FIGS. 1 and 2.

Figure 2:
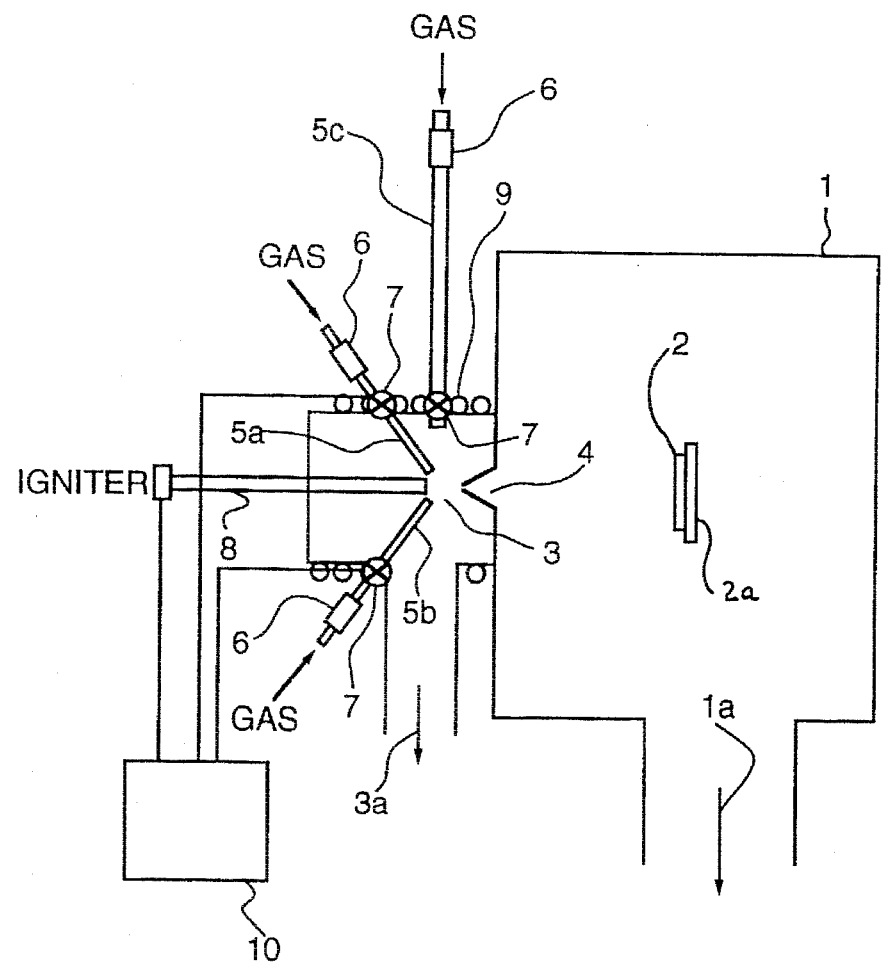
FIG. 2 is a diagram explaining the method and apparatus of the invention according to a second embodiment.
Figure 5:
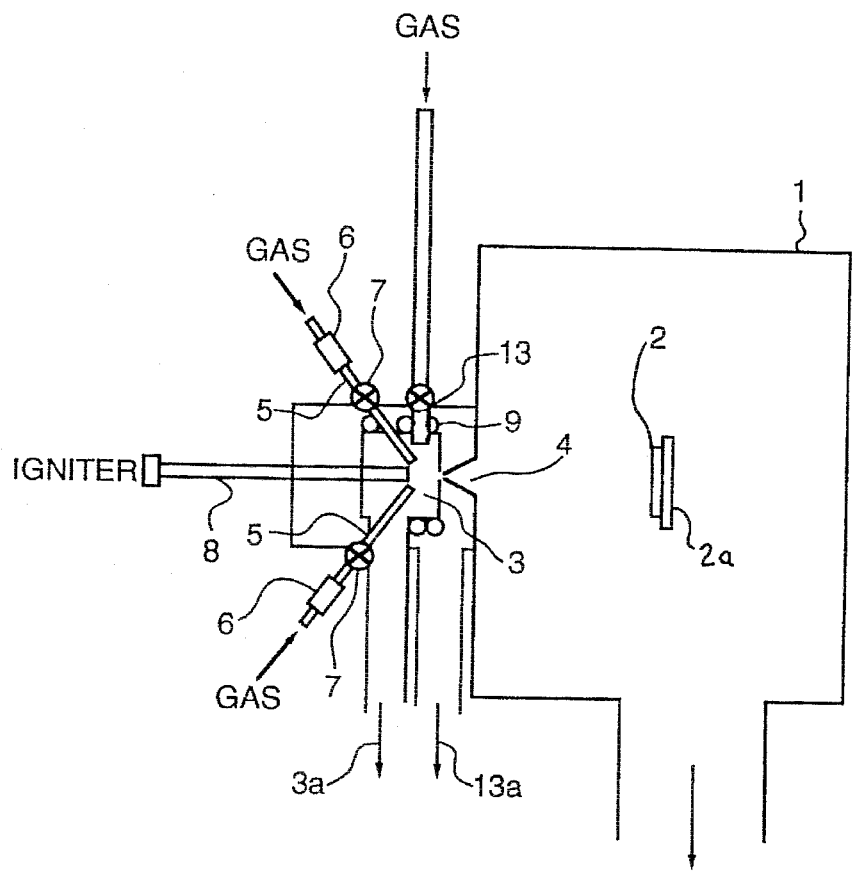
FIG. 5 is a diagram explaining the method and apparatus of the invention according to a fourth embodiment.

In FIG. 5, another embodiment of the invention is disclosed which includes an arrangement similar to that shown in FIGS. 1, 2 and 4 except with respect to the reaction chamber 3. In FIG. 5, a reaction chamber 3 is formed within the interior of an outer chamber space 13, which has its own vacuum pump for pumping out chamber 13, as indicated by arrow 13a. Outer chamber or space 13 is arranged between chamber 3 and chamber 1. Chamber 3 has an opening aligned with aperture 4. By this arrangement, a greater differential pressure can be achieved and maintained more effeciently between reaction chamber 3 and sample chamber 1, as compared with the previous embodiments, i.e. the differential pressure is increased and maintained by providing an intermediate vacuum chamber 13. Additional vacuum chamber stages could be applied in order to increase and/or maintain the required differential pressure between chambers 1 and 3, as desired. From the viewpoint of providing an efficient and economical apparatus for performing the invention, the configuration of FIG. 5 is considered to be the preferred embodiment because it is quite practical. Furthermore, the use of one or more intermediate stages 13 as shown in FIG. 5, can be employed in any of the previous embodiments.

According to the invention, the translation energy of the constituent atoms or molecules and particles of the beam that is formed can be varied by changing the gases introduced into chamber 3. Although the foregoing embodiments have discussed introducing hydrogen and oxygen, a chemical reaction within chamber 3 can be formed by introducing organic molecules and oxygen according to the following formulas (2) and (3).

$$CH_4 + 2O_2 \rightarrow CO_2 + H_2O \tag{2}$$

$$C_2H_6 + 5O_2 \rightarrow 2CO_2 + 3H_2O \tag{3}$$

Also, a suitable chemical reaction can be formed by introducing halogen molecules with oxygen according to formula (4) as follows.

$$2Cl_2 + O_2 \rightarrow 2Cl_2O \tag{4}$$

Further, a suitable chemical reaction can be formed by introducing halogen molecules with hydrogen according to one of the following formulas, for example.

$$Cl_2 + H_2 \rightarrow 2HCl \tag{5}$$

$$F_2 + H_2 \rightarrow 2HF \tag{6}$$

As another example, molecules of a carbonic acid gas can be formed by the combustion or explosion reaction of organic molecules with oxygen. Accordingly, it is possible to form highly reactive high-speed particles for projection in the beam by utilizing the combustion or explosion reaction between halogen elements (chlorine molecules and fluorine molecules) or of molecules including halogen elements with oxygen or hydrogen, as set forth above, in order to etch a sample to be processed.

In each apparatus of the foregoing embodiments, only one molecular or atomic beam is disclosed as being formed, but more than one beam can be formed as desired so that a sample having a wide area can be processed with several of the beams simultaneously.

Figure 6:
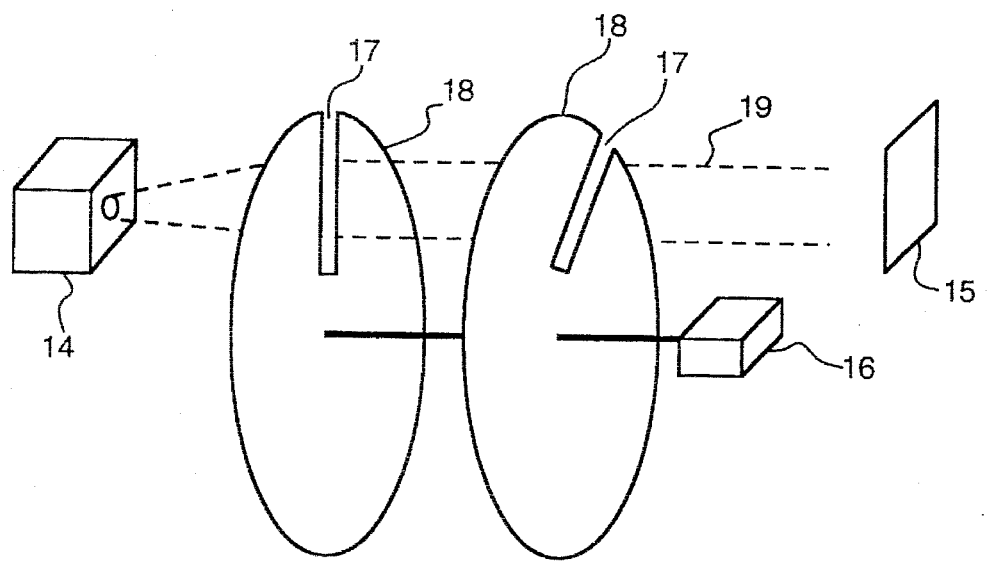
FIG. 6 is a diagram showing the apparatus of the invention used with a device for controlling the exposure of a substrate with the beam that is generated.

The projecting of one or more beams onto the surface of an object or substrate to be treated can be controlled by selecting a specific translation energy range in accordance with the embodiment of the invention shown in FIG. 6. Two disks 18, each having a slit 17 are rotated by a motor 16. The disks are interposed between the source 14 of the atomic or molecular beam generated by the present invention and the surface of a sample 15 that is to be processed. When the disks are rotated at a constant speed, only the atoms, molecules and/or particles in the beam of a predetermined speed range pass through the slits 17 in the disks. The speed range is determined by the revolving speed of the disks 18, the width of the slits 17 and the deviation in position of the slits 17 between the two disks 18. Thus, an atomic or molecular beam of a specified translation energy is permitted to irradiate sample 15. By controlling the energy of the beam in this manner, fine processing, including etching with high selectivity, can be achieved.

Figure 7:
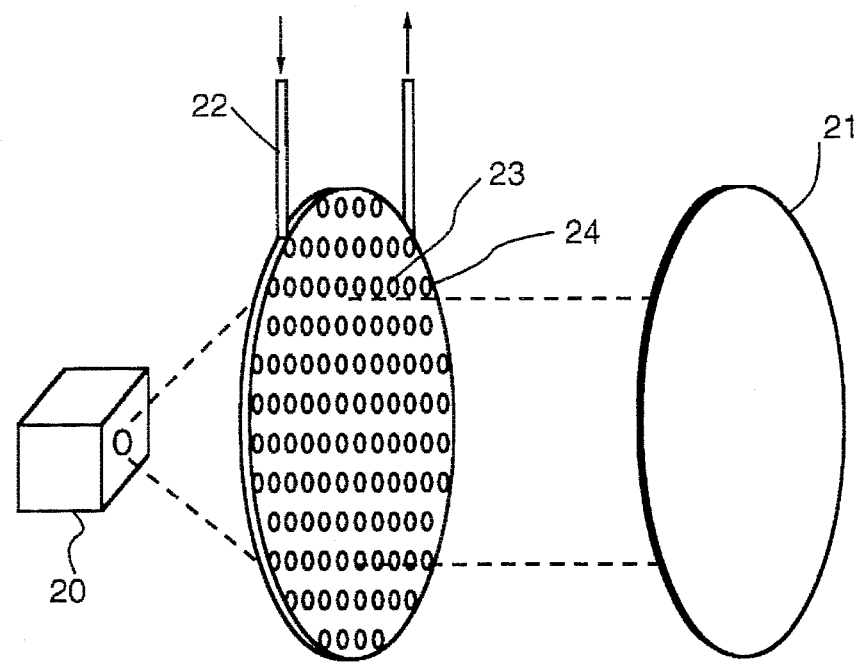
FIG. 7 and 8 are diagrams illustrating use of the apparatus of the invention with a collimator.

One problem with forming a beam as set forth in the foregoing embodiments of the present invention is the concentration of energy at the center of the beam. Accordingly, the embodiment of the invention shown in FIG. 7 includes a collimator 24 positioned between a source 20 of an atomic or molecular beam and a sample 21 that is to be processed. Collimator 24 preferably has a cooling mechanism 22 for circulating a cooling medium and a plurality of apertures 23 for evenly distributing the beam over a wide area of sample 21. In a preferred embodiment, the collimator is made of copper and is cooled with water along its outer peripheral portion. The high speed atomic or molecular beam emitted from the aperture of the source 20 passes through collimator 24 and is caused to impinge upon sample 21 perpendicularly.

Figure 8:
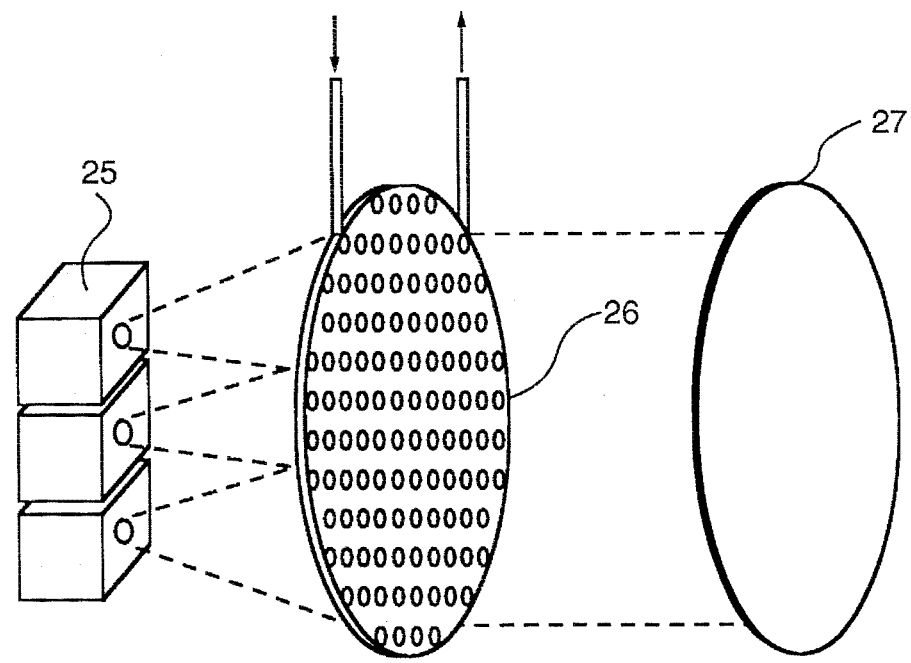

FIG. 8 shows a further embodiment of the present invention wherein a collimator 26 having a suitable cooling mechanism is used in combination with a plurality of sources for forming an atomic or molecular bean 25. According to the embodiment shown in FIG. 8, a wide area of sample 27 can be treated, and the direction of the beams impacting the sample can be insured to be perpendicular.

Additional embodiments of the invention are possible, and the foregoing embodiments merely set forth the preferred embodiments of the invention and are not intended to limit the disclosure of the invention. For example, a combustion or explosion reaction of a silane-type gas with oxygen can be generated in the reaction chamber of the apparatus to form a beam having high speed silicon or silicon oxide molecules that are deposited on the surface of a sample to be processed. In this manner, a thin film can be formed on the sample.

While preferred embodiments of the invention have been disclosed with respect to the various embodiments presented herein, the invention is defined by the spirit and scope of the appended claims.

We claim:

1. A method of generating one of a molecular or atomic beam for treating a sample surface, comprising the steps of:

preparing an apparatus comprising a vacuum reaction chamber, a vacuum sample chamber and an aperture through which reaction products produced in said vacuum reaction chamber pass to form a beam that is projected onto the sample in said vacuum sample chamber for treating the surface of the sample to be processed;

setting a sample within said vacuum sample chamber;

introducing at least two types of gases that react with one another into said vacuum reaction chamber;

initiating an explosion reaction or a combustion reaction of said two gases within said vacuum reaction chamber that generates said reaction products and translation energy for accelerating said reaction products; and projecting said reaction products having said translation energy generated by said explosion reaction or said combustion reaction into said beam by passing said reaction products through said aperture onto the sample in said vacuum sample chamber for containing the sample to be processed.

2. A method according to claim 1, further including evacuating said reaction chamber and said sample chamber to different pressures, respectively, wherein said sample chamber pressure is at least ten times less than said reaction chamber pressure.

3. A method according to claim 1, further including introducing an additional gas into said reaction chamber having one of atoms or molecules that react with a sample being processed, wherein said one of said atoms or molecules of said additional gas are included with said reaction products in said beam by a seeding effect and projected into said reaction chamber by said translation energy from said chemical reaction for etching a sample held in said sample chamber.

4. A method according to claim 1, wherein a surface of a sample to be processed is cleaned with atoms or molecules of said beam that have been accelerated by the translation energy generated from the chemical reaction.

5. A method according to claim 1, wherein said introducing includes introducing gases that when reacted together in said initiating step generate atoms or molecules as said reaction products that are accelerated by the translation energy and that are reactive with a sample to be processed for etching a surface of the sample.

6. A method according to claim 1, wherein said introducing includes introducing gases that when reacted together in said initiating step generate atoms or molecules as said reaction products that are accelerated by the translation energy to be deposited on a surface of a sample to be processed for forming a thin film on the surface.

7. A method according to claim 1, wherein the step of initiating is based upon oxidation of one of the gases.

8. A method according to claim 1, wherein said initiating of said explosion reaction or said combustion reaction is continued to run in succession without a break in the explosion or combustion.

9. A method according to claim 1, wherein said introducing step includes introducing oxygen and hydrogen as the at least two types of gases.

10. A method according to claim 1, wherein said introducing step includes introducing a gas with organic molecules and oxygen as the at least two types of gases.

11. A method according to claim 1, wherein said introducing step includes introducing a gas with a halogen element or molecules containing a halogen element and oxygen as the at least two types of gases.

12. A method according to claim 1, wherein said introducing step includes introducing a gas with a halogen element or molecules containing a halogen element and hydrogen as the at least two types of gases.

13. A method according to claim 1, wherein said introducing step includes introducing a silane and oxygen as the at least two types of gases f.

14. A method according to claim 1, wherein the step of initiating initiates a chain reaction of the at least two types of gases.

15. A method according to claim 1, wherein the step of initiating reacts chlorine molecules with fluorine molecules.

16. A method according to claim 2, further including confining said translation energy of said beam to a range by projecting said beam through two disks each having a slit and driven in rotation to the sample to be processed so that the sample to be processed is irradiated with only those atomic or molecular beams of a particular translation energy passing through said slits.

17. A method according to claim 1, further including introducing an additional gas different from said at least two types of gases into said reaction chamber, wherein atoms or molecules of said additional gas are accelerated by a seeding effect due to said accelerating of said reaction products and are projected onto said sample in said projecting step.

18. A method according to claim 1, further including projecting said beam through a collimator to the sample to be processed.

19. A method according to claim 1, the kinetic energy of said atoms or molecules that impinge or impact said sample surface is between 0.5 eV to 20 eV.

* * * * *